(12) United States Patent
Homme et al.

(10) Patent No.: US 6,919,569 B2
(45) Date of Patent: Jul. 19, 2005

(54) RADIATION DETECTOR AND METHOD OF MANUFACTURE THEREOF

(75) Inventors: Takuya Homme, Hamamatsu (JP); Kazuhisa Miyaguchi, Hamamatsu (JP); Toshio Takabayashi, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 63 days.

(21) Appl. No.: 10/276,722

(22) PCT Filed: May 18, 2001

(86) PCT No.: PCT/JP01/04174

§ 371 (c)(1),
(2), (4) Date: Nov. 18, 2002

(87) PCT Pub. No.: WO01/88569

PCT Pub. Date: Nov. 22, 2001

(65) Prior Publication Data

US 2003/0116714 A1 Jun. 26, 2003

(30) Foreign Application Priority Data

May 19, 2000 (JP) ........................................ 2000-148308

(51) Int. Cl.$^7$ ................................................ G01T 1/20
(52) U.S. Cl. .................. 250/370.11; 427/601; 118/728; 250/336.1; 250/370.01
(58) Field of Search .................. 250/370.11, 336.1, 250/370.01; 427/601; 118/728

(56) References Cited

U.S. PATENT DOCUMENTS

| | | | | |
|---|---|---|---|---|
| 5,132,539 A | * | 7/1992 | Kwasnick et al. | 250/361 R |
| 5,153,438 A | | 10/1992 | Kingsley et al. | 250/370.09 |
| 5,179,284 A | | 1/1993 | Kingsley et al. | 250/370.11 |
| 5,187,369 A | | 2/1993 | Kingsley et al. | 250/370.11 |
| 5,208,460 A | | 5/1993 | Rougeot et al. | 250/368 |
| 6,042,267 A | | 3/2000 | Muraki et al. | 378/169 |
| 6,172,371 B1 | | 1/2001 | DeJule et al. | 250/370.11 |
| 6,262,422 B1 | | 7/2001 | Homme et al. | 250/370.11 |
| 6,278,118 B1 | | 8/2001 | Homme et al. | 250/370.11 |
| 6,328,838 B1 | * | 12/2001 | Wirth et al. | 156/212 |
| 6,414,315 B1 | | 7/2002 | Wei et al. | 250/370.11 |
| 6,624,421 B1 | * | 9/2003 | Takeda | 250/363.01 |
| 6,777,690 B2 | * | 8/2004 | Homme et al. | 250/483.1 |
| 2001/0030291 A1 | | 10/2001 | Homme et al. | 250/483.1 |
| 2001/0045522 A1 | | 11/2001 | Homme et al. | 250/361 |
| 2002/0158205 A1 | | 10/2002 | Sato et al. | 250/361 |
| 2003/0221620 A1 | * | 12/2003 | Yamazaki | 118/722 |

FOREIGN PATENT DOCUMENTS

| | | |
|---|---|---|
| EP | 0 235 731 A1 | 9/1987 |
| EP | 1 002 887 A1 | 11/1999 |
| EP | 1 003 226 A2 | 5/2000 |
| EP | 1 258 737 A1 | 11/2002 |
| EP | 1 258 738 A 1 | 11/2002 |
| JP | SHO59-122988 | 7/1984 |
| JP | HEI05-060871 | 3/1993 |
| JP | HEI07-027863 | 1/1995 |
| JP | HEI10-282243 | 10/1998 |
| JP | 2000-180597 | 6/2000 |
| WO | WO98/36291 | 8/1998 |
| WO | WO99/66346 | 12/1999 |

* cited by examiner

Primary Examiner—David Porta
Assistant Examiner—Christine Sung
(74) Attorney, Agent, or Firm—Drinker Biddle & Reath LLP

(57) ABSTRACT

A solid-state imaging element 2 having a light-receiving portion where a plurality of photoelectric conversion elements 21 are arranged, and electrode pads 22 electrically connected to the photoelectric conversion elements 21 is mounted on a substrate 1. A scintillator 3 is formed on the surface of the light-receiving portion of the solid-state imaging element. Around a support surface 10 where the solid-state imaging element 2 of the substrate 1 is mounted, holding portions 14 and 15 are formed on opposing side walls to hold and project the surface of the light-receiving portion from a vapor deposition holder toward a vapor deposition chamber in forming the scintillator 3.

3 Claims, 17 Drawing Sheets

RADIATION DETECTOR AND METHOD OF MANUFACTURE THEREOF

TECHNICAL FIELD

The present invention relates to a radiation detector used for radiation imaging and a manufacturing method thereof and, more particularly, to a compact dental radiation detector used upon insertion into an oral cavity and a manufacturing method thereof.

BACKGROUND ART

X-ray image sensors using a CCD instead of an X-ray sensitive film are becoming popular as a medical X-ray diagnostic apparatus. In such a radiation imaging system, a radiation detection device having a plurality of pixels acquires two-dimensional image data by radiation as an electrical signal, and this signal is processed by a processor and displayed on a monitor.

As a dental radiation detector used upon insertion into an oral cavity, a radiation detector which is disclosed in JP 10-282243 A has been known. In this radiation detector, an FOP (Fiber Optical Plate) with a scintillator is stuck on the light-receiving surface of a CCD. The radiation detector has a mechanism to convert incident radiation into light by the scintillator, guide the light to the CCD by the FOP, and detect the light.

DISCLOSURE OF INVENTION

A dental radiation detector used upon insertion into an oral cavity requires a larger imaging area while downsizing and thinning the whole detector. In the above apparatus, thinning is limited in the presence of the FOP. As disclosed in WO98/36291, a scheme for thinning the detector by directly forming a scintillator on the light-receiving surface of an imaging element is considered. However, when a light-receiving portion is formed on the entire light-receiving surface, it is difficult to uniformly form the scintillator on the entire light-receiving portion, thus decreasing the output and resolution of end portions. This makes it difficult to attain the large imaging area.

It is an object of the present invention to provide a radiation detector which can attain both a small, thin structure and a large imaging area, and can be easily manufactured, and manufacturing method thereof.

To solve the above problems, a radiation detector according to the present invention comprises (1) a solid-state imaging element where a plurality of photoelectric conversion elements are arranged, (2) a scintillator formed on a surface of a light-receiving portion of the solid-state imaging element by vapor deposition, and (3) a substrate having a support surface where the solid-state imaging element is mounted, the substrate having holding portions which project laterally from at least two opposing side surfaces of the mounted solid-state imaging element to hold and project the surface of the light-receiving portion of the solid-state imaging element from a vapor deposition holder into a vapor deposition chamber in forming the scintillator.

On the other hand, a radiation detector manufacturing method according to the present invention comprises the steps of: (1) mounting and fixing a solid-state imaging element, where a plurality of photoelectric conversion elements are arranged, on a support surface of a substrate, (2) holding with holding portions of the substrate, which project laterally from at least two opposing side surfaces of the solid-state imaging element, to project a surface of a light-receiving portion of the solid-state imaging element from a vapor deposition holder into a vapor deposition chamber, and (3) forming a scintillator by vapor deposition on the projecting surface of the light-receiving surface.

That is, the radiation detector according to the present invention is manufactured by forming the scintillator on the surface of the light-receiving portion of the solid-state imaging element by vapor deposition such as vapor deposition after the solid-state imaging element is fixed on the support surface of the substrate. In this case, the holding portions of the substrate are used to project the surface of the light-receiving portion toward the vapor deposition chamber. Hence, no projecting portion which becomes an obstacle is formed on the light-receiving portion in forming the scintillator, thereby uniformly forming the scintillator on the entire light-receiving portion. This can ensure the resolution in a peripheral region and attain the large area of the effective light-receiving portion. The FOP is not used, thus facilitating thinning the detector.

These holding portions may be tab-shaped to conform to the side wall of the substrate, or the upper surfaces of these holding portions may be continuously flush with the support surface. This facilitates manufacturing the substrate and mounting the solid-state imaging element on the substrate.

BEST MODE OF CARRYING OUT THE INVENTION

Figure 1:
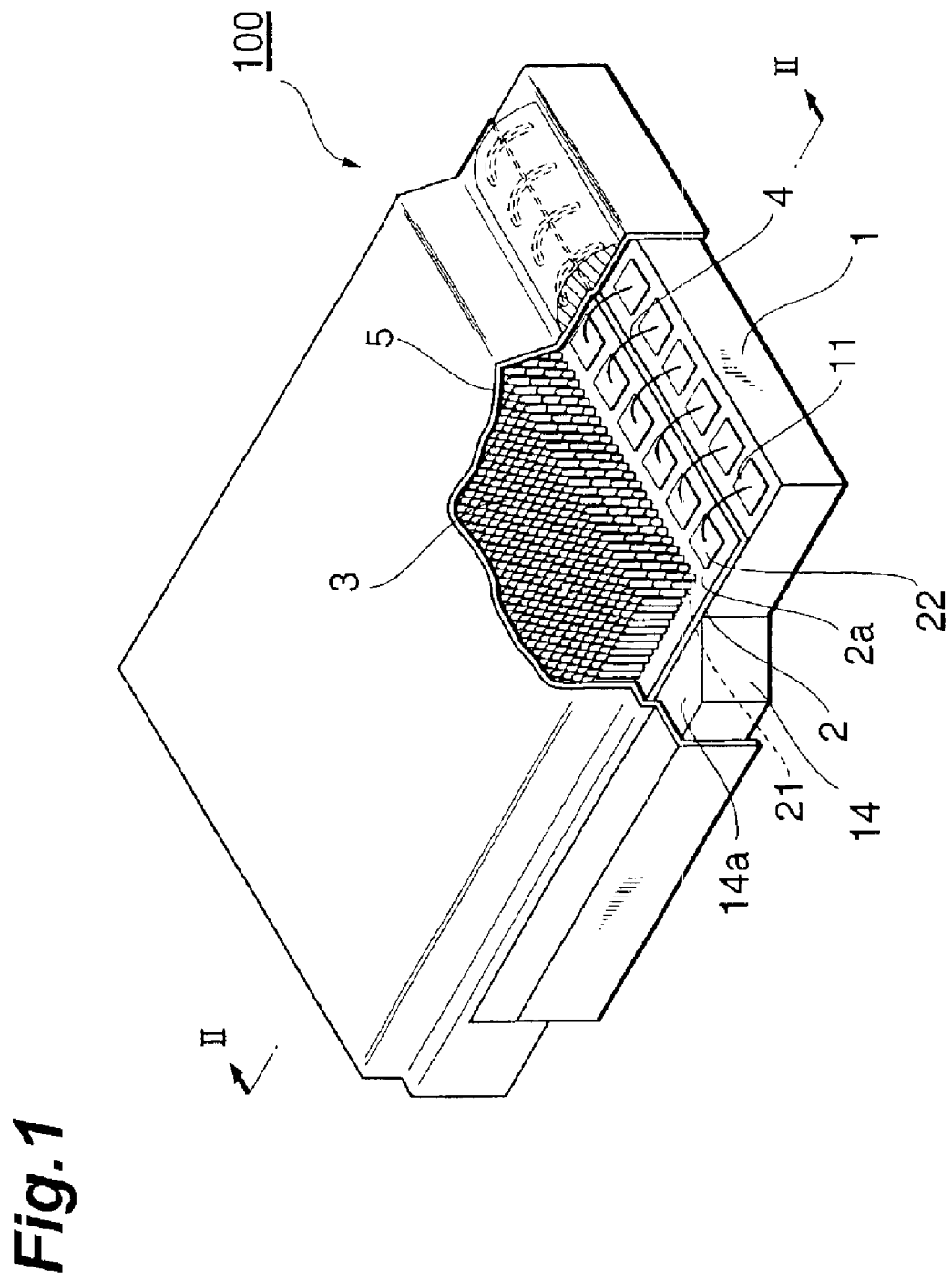
FIG. 1 is a perspective view showing an embodiment of a radiation detector according to the present invention.

Preferred embodiments of the present invention will be described in detail below with reference to the accompanying drawings. To facilitate the comprehension of the explanation, the same reference numerals denote the same parts, where possible, throughout the drawings, and a repeated explanation will be omitted. The size and shape of each drawing need not always be the same as the actual design. Some parts are exaggerated for convenience of understanding.

Figure 2:
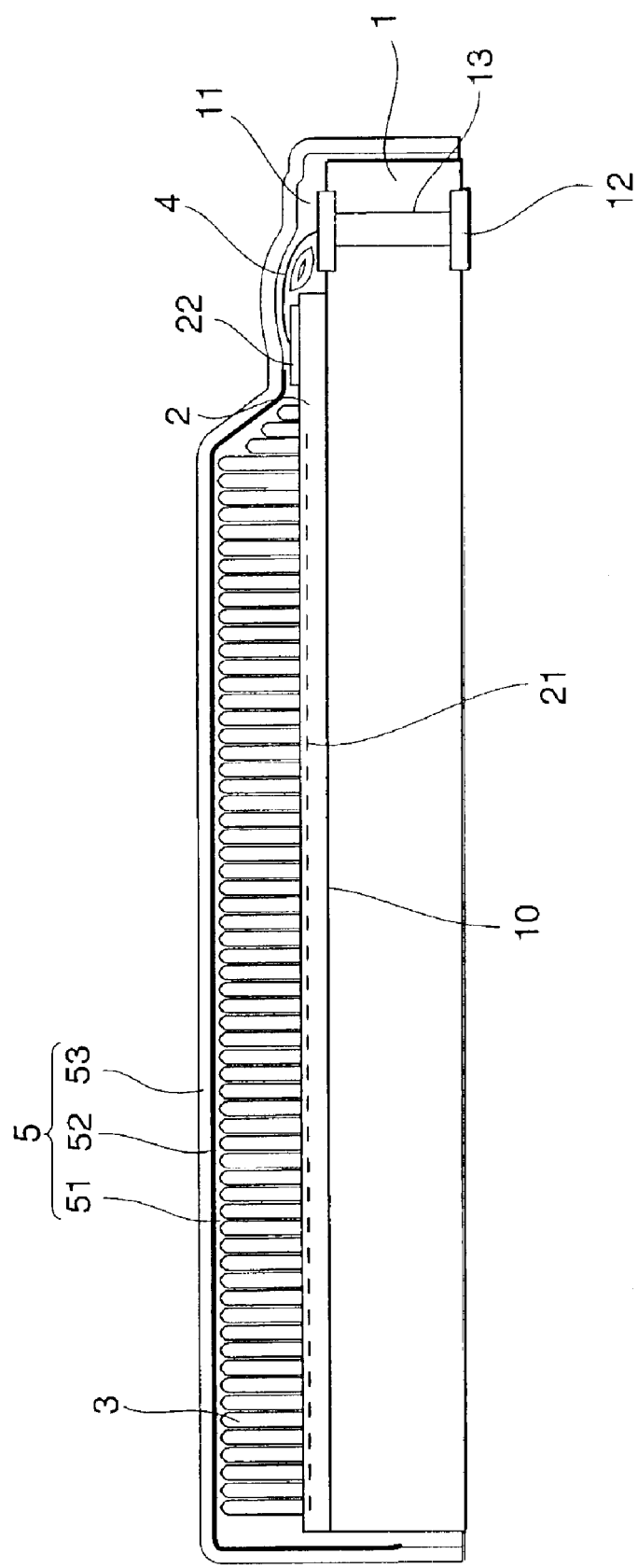
FIG. 2 is a side view thereof.

FIG. 1 is a perspective view showing an embodiment of a radiation detector according to the present invention, and FIG. 2 is a sectional view thereof. A radiation detector 100 of this embodiment is constituted by mounting a solid-state imaging element 2 on a ceramic substrate 1. The substrate 1 has in the center of the upper surface a support surface 10 where the solid-state imaging element 2 is set. A plurality of electrode pads 11 are arrayed along one side of the support surface 10. These electrode pads 11 are electrically connected to external connection electrode terminals 12 on the lower surface of the substrate 1 via wiring lines 13 extending through the substrate 1. The radiation detector also has holding portions 14 and 15 which project laterally from two opposing side walls 1a and 1b interposing the support surface 10. These holding portions 14 and 15 have a trapezoidal shape, in which one side on the substrate 1 is longer when viewed from the light incident surface side of the radiation detector 100. Top surfaces 14a and 15a of these holding portions 14 and 15 are continuously flush with the support surface 10.

The solid-state imaging element 2 is comprised of a CCD image sensor, and a portion where photoelectric conversion elements 21 are arrayed forms a light-receiving portion. Each photoelectric conversion element 21 is electrically connected via a signal line (not shown) to a corresponding one of electrode pads 22 arranged on one side of the solid-state imaging element 2. The solid-state imaging element 2 is mounted on the support surface 10 of the substrate 1 such that corresponding electrode pads 11 and 22 are located close to each other. Corresponding electrode pads 11 and 22 are electrically connected by wiring lines 4.

A columnar scintillator 3 which converts incident radiation into light of a waveband sensed by the photoelectric conversion element 21 is formed by vapor deposition on the light-receiving portion of the solid-state imaging element 2. The scintillator 3 can be made of various materials, and can preferably adopt Tl-doped CsI with high emission efficiency.

The protective film 5 covers the surfaces of the solid-state imaging element 2 and substrate 1. The protective film 5 transmits X-rays and cuts off water vapor. The protective film 5 is formed by stacking an electrical insulating first organic film 51, metal thin film 52, and electrical insulating second organic film 53 on the substrate 1.

The first and second organic films 51 and 53 are preferably made of a polyparaxylylene resin (Parylene available from Three Bond Co., Ltd.), and particularly poly-parachloroxylylene (Parylene C also available from Three Bond Co., Ltd.). The parylene coating film hardly transmits water vapor and gas. This film has high repellency, high chemical resistance, and high electrical insulating property even as a thin film. In addition, the parylene coating film is transparent to radiation and visible light. These properties are suitable for the organic films 51 and 53. The metal thin film 52 can be a metal thin film of gold, silver, aluminum, or the like. The metal thin film 52 functions as a mirror which increases the detection sensitivity of the detector by reflecting, of light emitted by the scintillator 3, light traveling toward not the solid-state imaging element 2 but the radiation incident plane.

Figure 3:
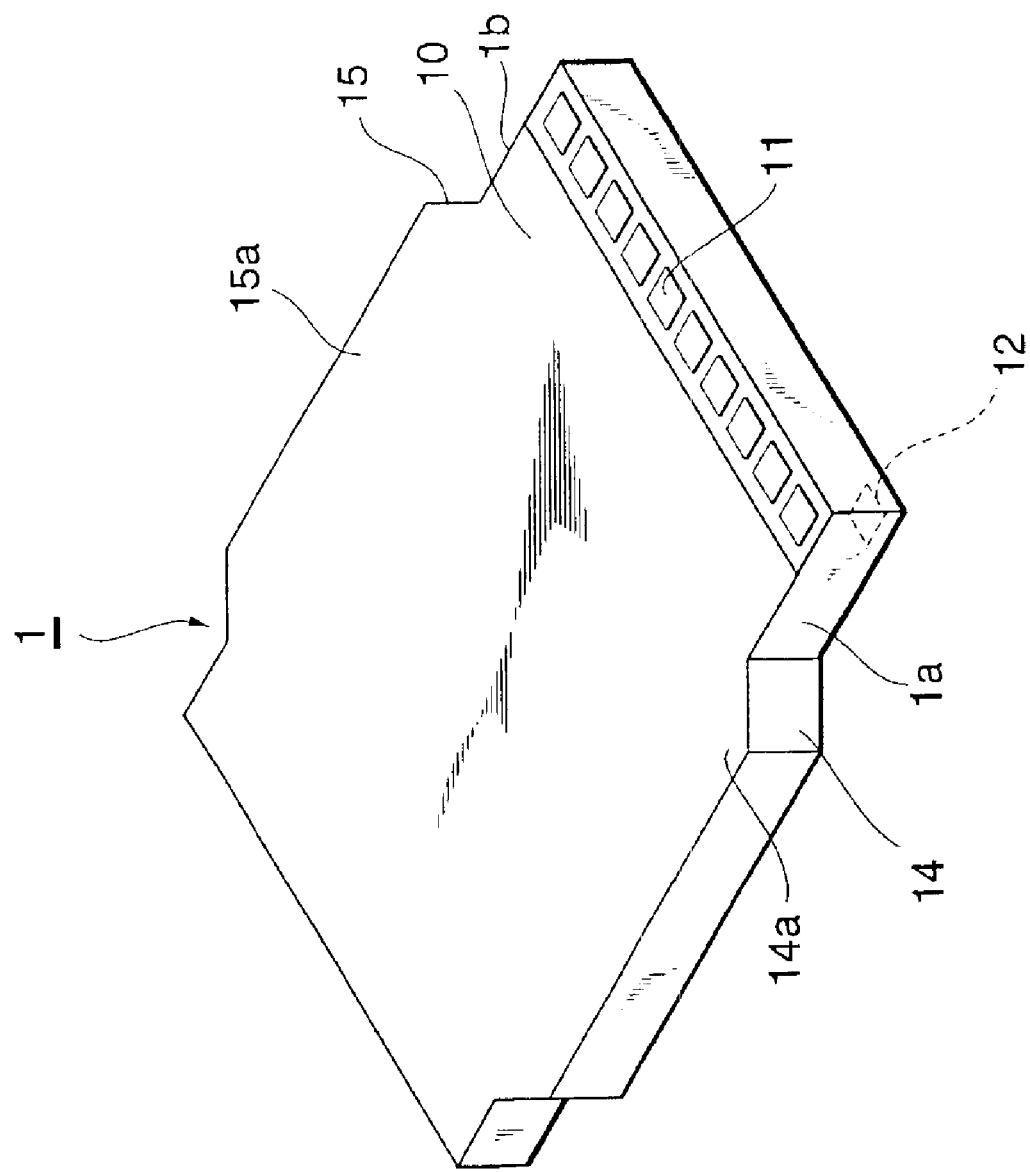
FIG. 3 is a perspective view of a substrate used for the apparatus.

The manufacturing method of the radiation detector 100 according to the present invention will be explained in detail with reference to FIGS. 3 to 13. First, the substrate 1 as shown in FIG. 3 is prepared. The external connection electrode terminals 12 are arrayed on the lower surface of the substrate 1 while the electrode pads 11 are arrayed on the upper surface of the substrate 1 as described above. When viewed from the support surface 10 side, the substrate 1 has a shape in which two narrow trapezoids (holding portions 14 and 15) are formed with the longer sides being attached to the two opposing sides of the rectangular substrate.

Figure 4:
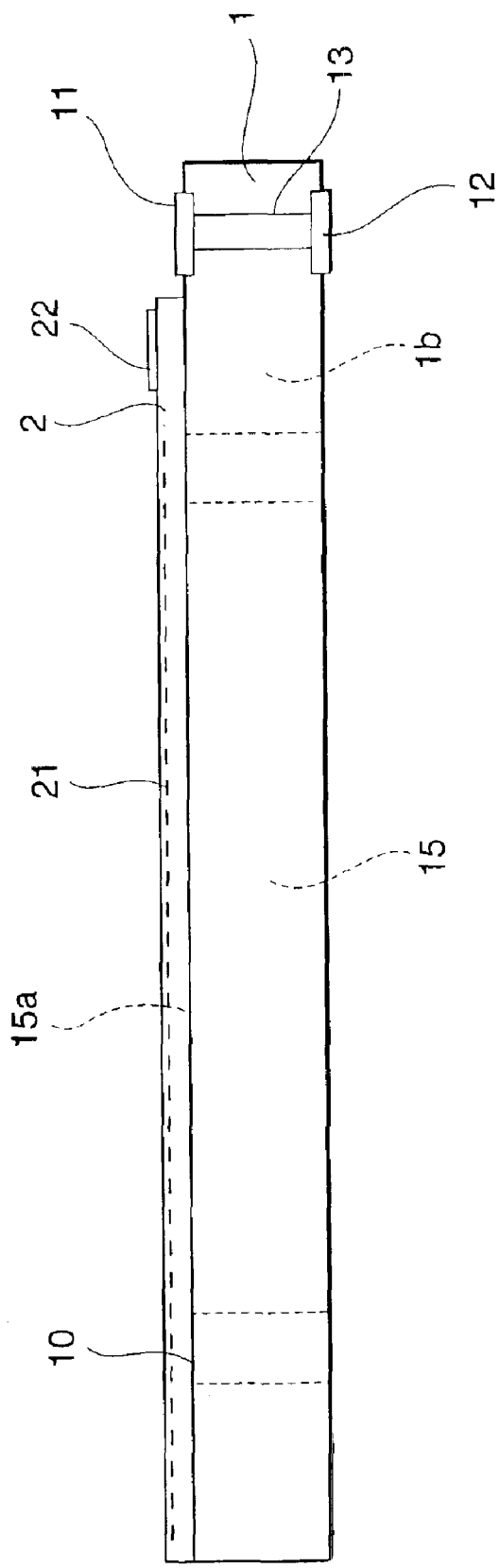
FIGS. 4 to 6 are side and perspective views showing some of the steps in the manufacturing method of the radiation detector according to the present invention.
Figure 5:
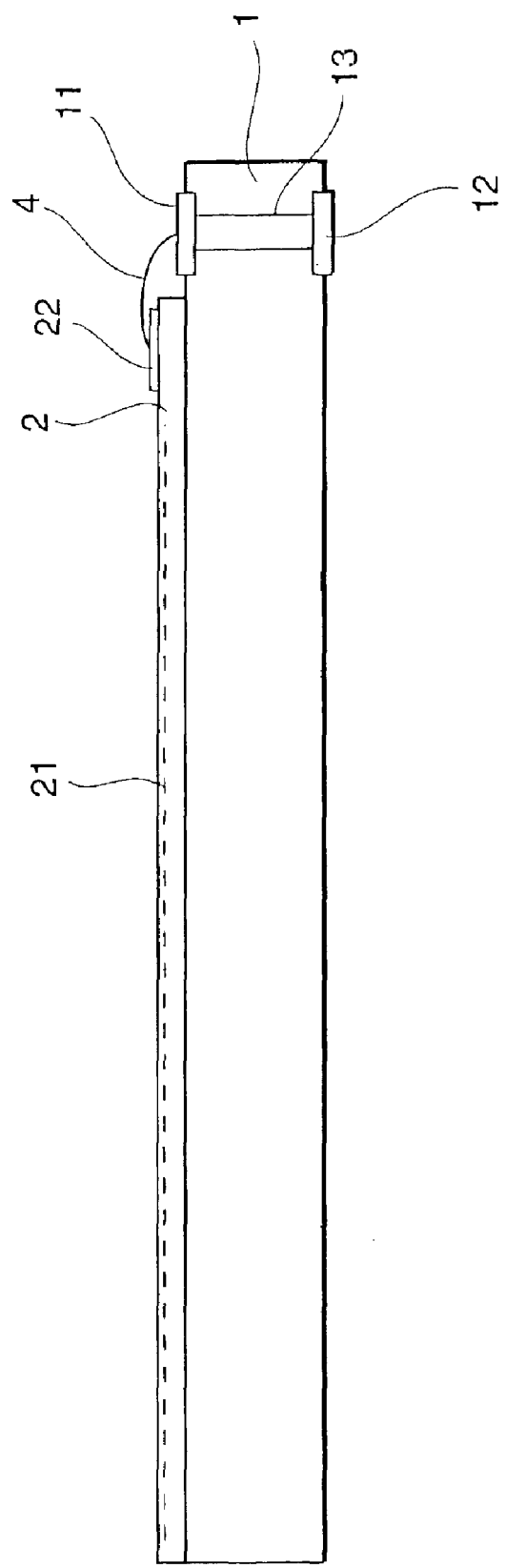
Figure 6:
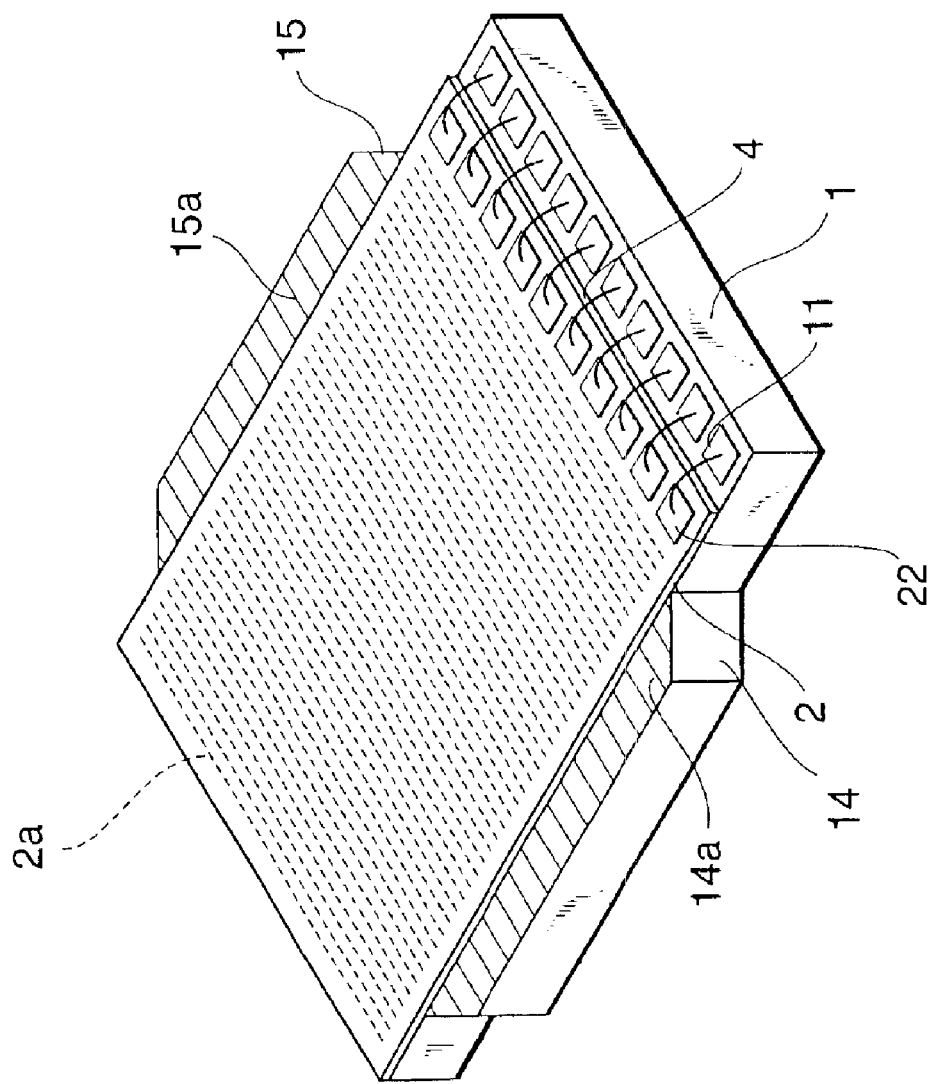

The solid-state imaging element 2 is mounted on the support surface 10 with the light-receiving surface of the photoelectric conversion element 21 facing up, such that the electrode pads 22 are directed to the electrode pads 11 of the substrate 1 (see FIG. 4). At this time, positioning the solid-state imaging element 2 by using the side walls 1a and 1b of the substrate 1 and the corresponding side walls of the solid-state imaging element 2 facilitates fixing the solid-state imaging element 2. Then, the electrode pads 11 and 22 are electrically connected via the wiring lines 4 by wire bonding (see FIGS. 5 and 6).

Figure 7:
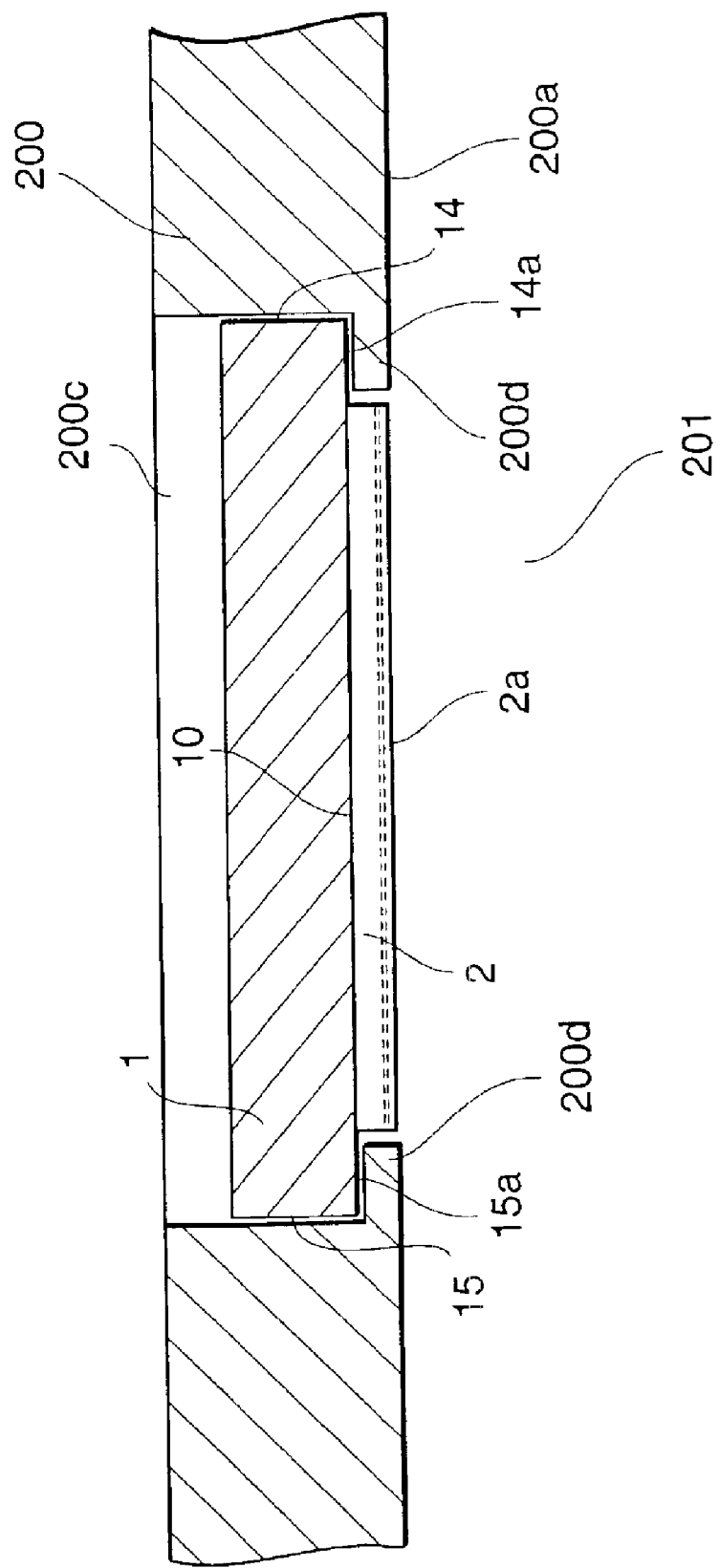
FIGS. 7 and 8 are sectional views of a vapor deposition substrate holder used in the manufacturing method.
Figure 8:
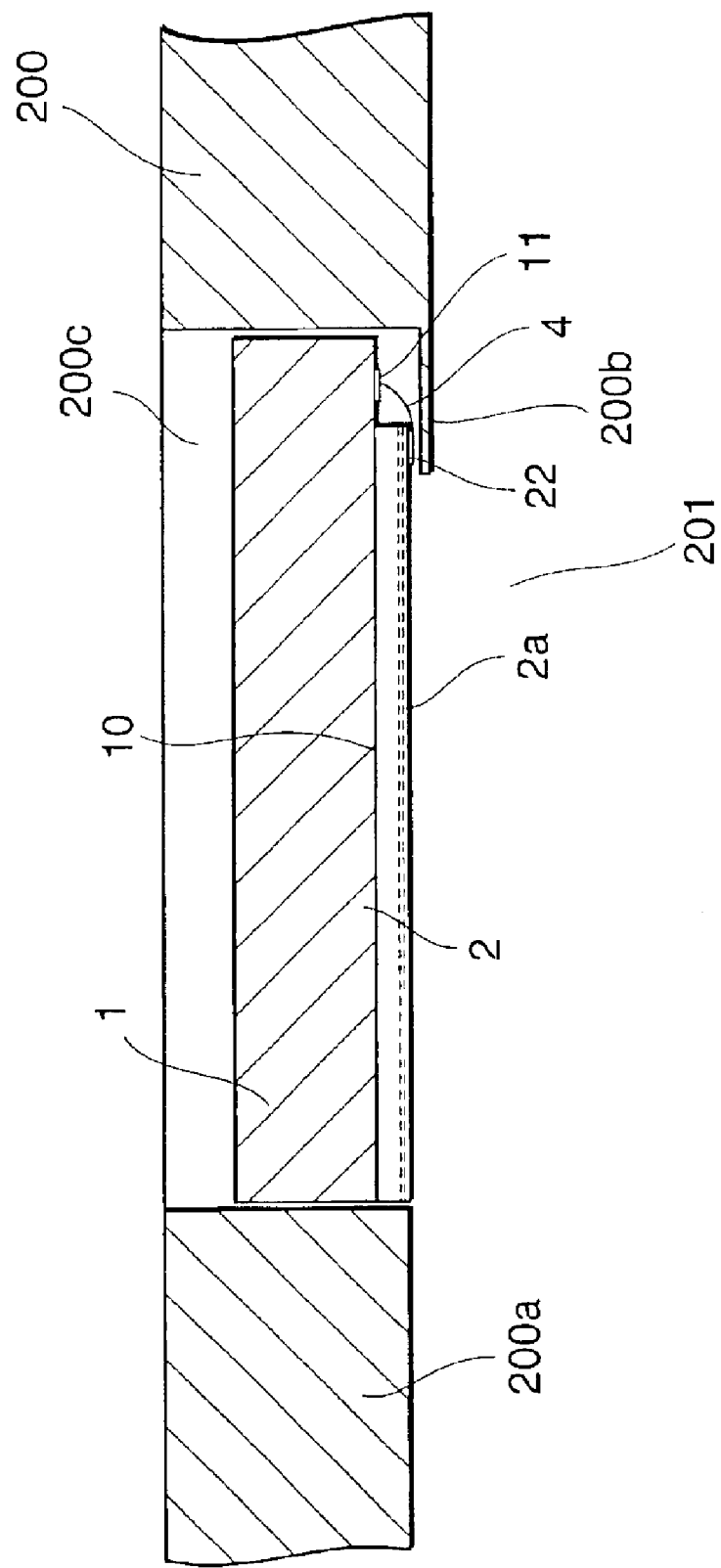

Next, the substrate 1 on which the solid-state imaging element 2 is mounted is set into a vapor deposition substrate holder 200. FIGS. 7 and 8 show the sectional views after setting. At this time, by supporting the corresponding holding portions 14 and 15 with 200d of the vapor deposition substrate holder 200 as shown in FIG. 7, the substrate 1 is stored and supported in a storing portion 200c. As shown in FIGS. 7 and 8, the incident surface 2a of the solid-state imaging element 2 is set near a vapor deposition-side surface 200a of the vapor deposition substrate holder 200, and preferably set such that the incident surface 2a projects toward a vapor deposition chamber 201. This structure can be implemented because the top surfaces 14a and 15a of the holding portions 14 and 15 are flush with the support surface 10 and at the lower position than the incident surface 2a of the solid-state imaging element 2. A cover portion 200a formed on the electrode pads 11 side of the vapor deposition substrate holder 200 covers the electrode pads 11 and 22 and wiring lines 4.

Figure 9:
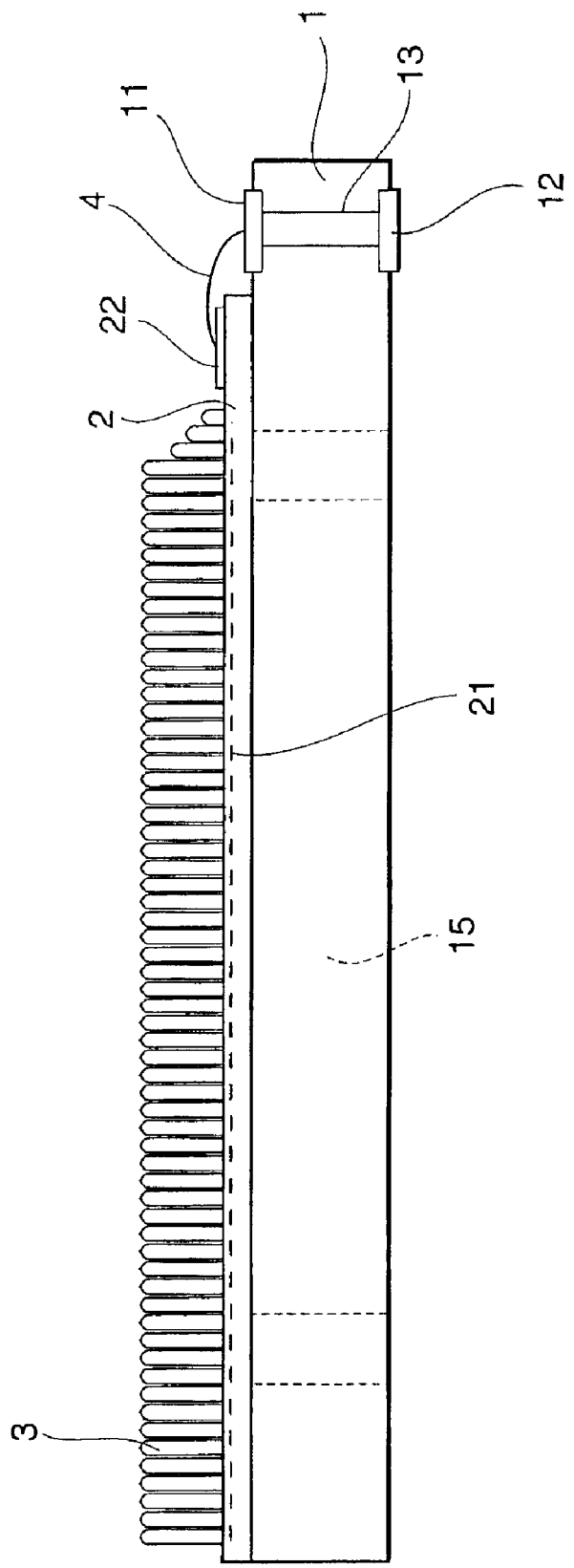
FIGS. 9 to 13 are side and perspective views showing the steps after FIG. 6.
Figure 10:
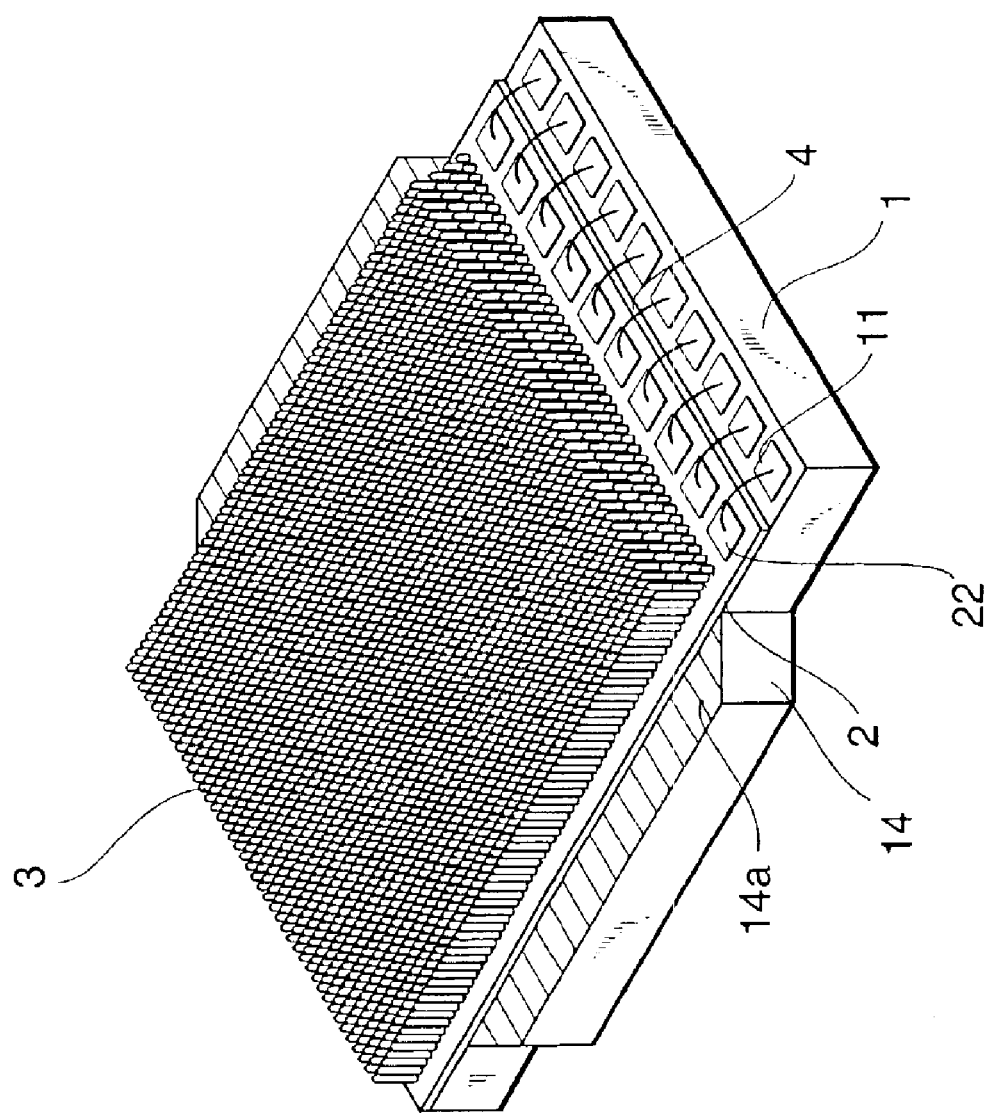

The vapor deposition substrate holder 200 is set in the vapor deposition apparatus in this state, and Tl-doped CsI is grown as columnar crystals to a thickness of about 200 μm by vacuum deposition on the light-receiving portion on the incident surface 2a of the solid-state imaging element 2, thereby forming the layer of a scintillator 3 (see FIGS. 9 and 10). Only the cover portion 200a projects toward the vapor deposition chamber 201 along the incident surface 2a around the light-receiving portion on the incident surface 2a of the solid-state imaging element 2 which is arranged in the vapor deposition substrate holder 200. Hence, the layer of the scintillator 3 with substantially uniform thickness can be formed to the peripheral portion of the light-receiving portion except the electrode pad 22 side.

Figure 11:
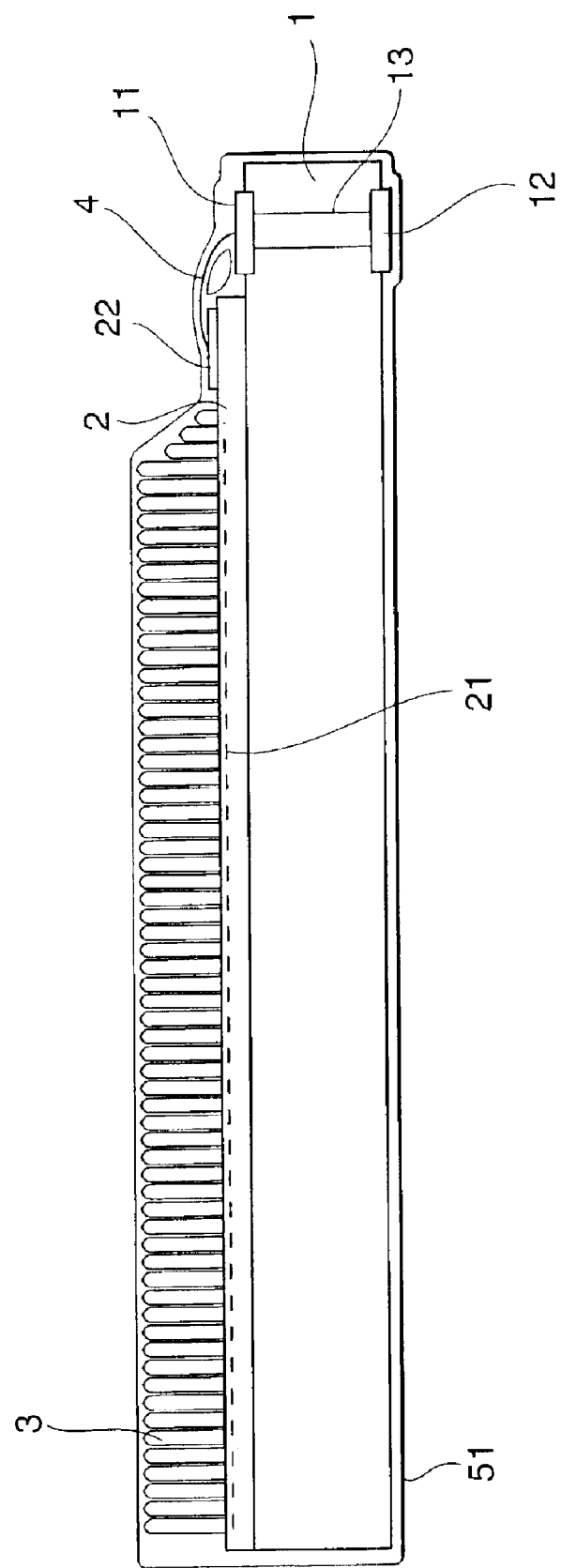

CsI is high deliquescent, and if CsI is kept exposed, it absorbs water vapor in air and dissolves. To protect the scintillator, as shown in FIG. 11, the overall substrate 1 with the solid-state imaging element 2 bearing the scintillator 3 is covered with a 10-μm thick parylene film by CVD (Chemical Vapor Deposition), thus forming a first organic film 51.

More specifically, coating by deposition is performed in vacuum, similar to vacuum deposition of a metal. This process includes the step of thermally decomposing a diparaxylylene monomer serving as a raw material and quenching the product in an organic solvent such as toluene or benzene to obtain diparaxylylene called a diner, the step of thermally decomposing the dimer to produce stable radical paraxylylene gas, and the step of absorbing and polymerizing the produced gas in a raw material to form a polyparaxylylene film with a molecular weight of about 500,000 by polymerization.

There is a gap between CsI columnar crystals, but parylene enters this narrow gap to a certain degree. The first organic film 51 tightly contacts the layer of the scintillator 3 and tightly seals the scintillator 3. The first organic film 51 is formed not only on the electrode pads 11 and 22 but also around the wiring lines 4 which connect them, and covers the wiring lines 4. This structure increases the adhesion and mechanical strengths of the wiring lines 4, and the wiring lines 4 can be easily handled in subsequent steps. By parylene coating, a uniform-thickness precise thin film coating can be formed on the corrugated layer surface of the scintillator 3. CVD formation of parylene can be achieved at room temperature with a lower degree of vacuum than in metal deposition, and parylene can be easily processed.

Figure 12:
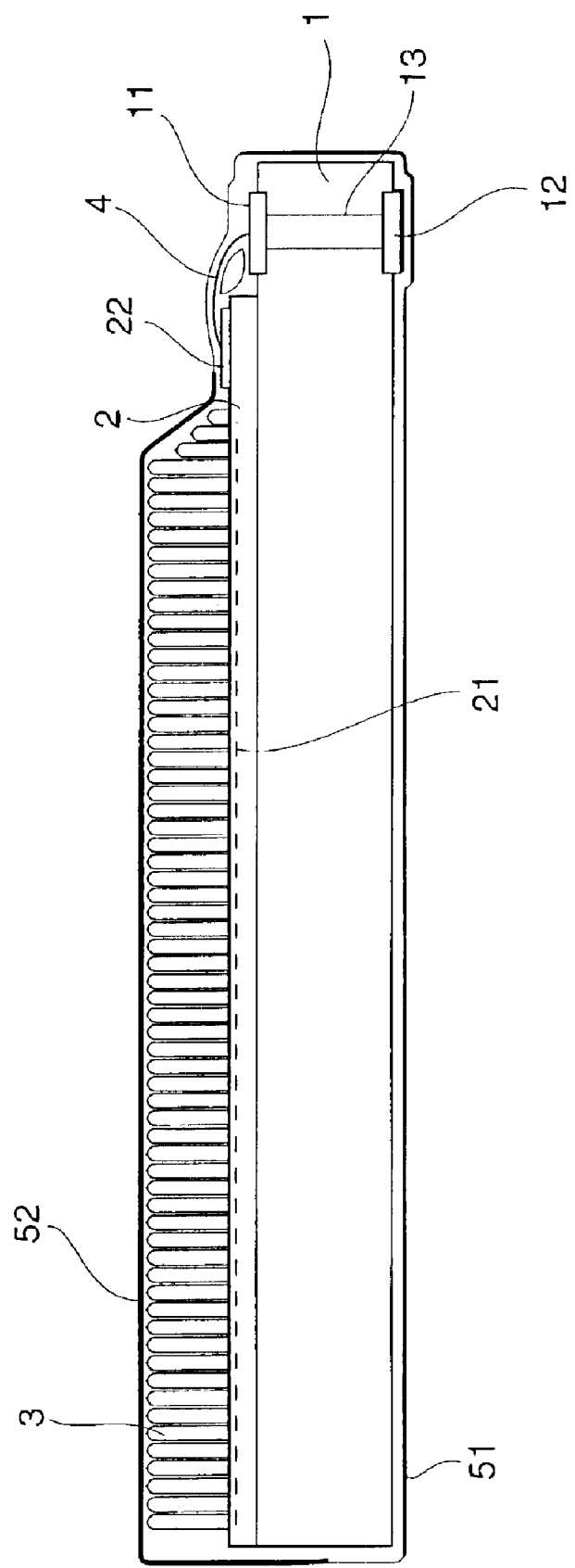

As shown in FIG. 12, a 0.15-$\mu$m thick Al film is formed on the incident surface of the first organic film 51 by vapor deposition, thereby forming a metal thin film 52. In forming the metal thin film 52, a proper mask (not shown) is desirably arranged in front of the layer of the scintillator 3 so as to form the metal thin film 52 only immediately above the layer of the scintillator 3 on the first organic film 51. Even if the mask is arranged, metal vapor may slightly flow outside the mask in vapor deposition. Especially at a small interval between the light-receiving portion and the electrode pad, it is difficult to form the metal thin film 52 only immediately above the layer of the scintillator 3. The metal may be deposited on the wiring lines 4 and the electrode pads 11 and 22. According to this embodiment, the metal thin film 52 is not directly formed on the wiring lines 4 and the electrode pads 11 and 22 because the wiring lines 4 and the electrode pads 11 and 22 are covered with the first organic film 51. Short-circuiting of the wiring lines 4 and the electrode pads 11 and 22 by the metal thin film 52 can be effectively prevented.

Also when no mask is arranged in vapor deposition of the metal thin film 52, the metal thin film 52 is formed on the wiring lines 4 and the electrode pads 11 and 22. However, the wiring lines 4 and the electrode pads 11 and 22 are covered with the first organic film 51, and short-circuiting can be prevented. The humidity resistance can be further increased by widely forming the metal thin film 52 which covers the wiring lines 4 and the electrode pads 11 and 22 via the first organic film 51.

Figure 13:
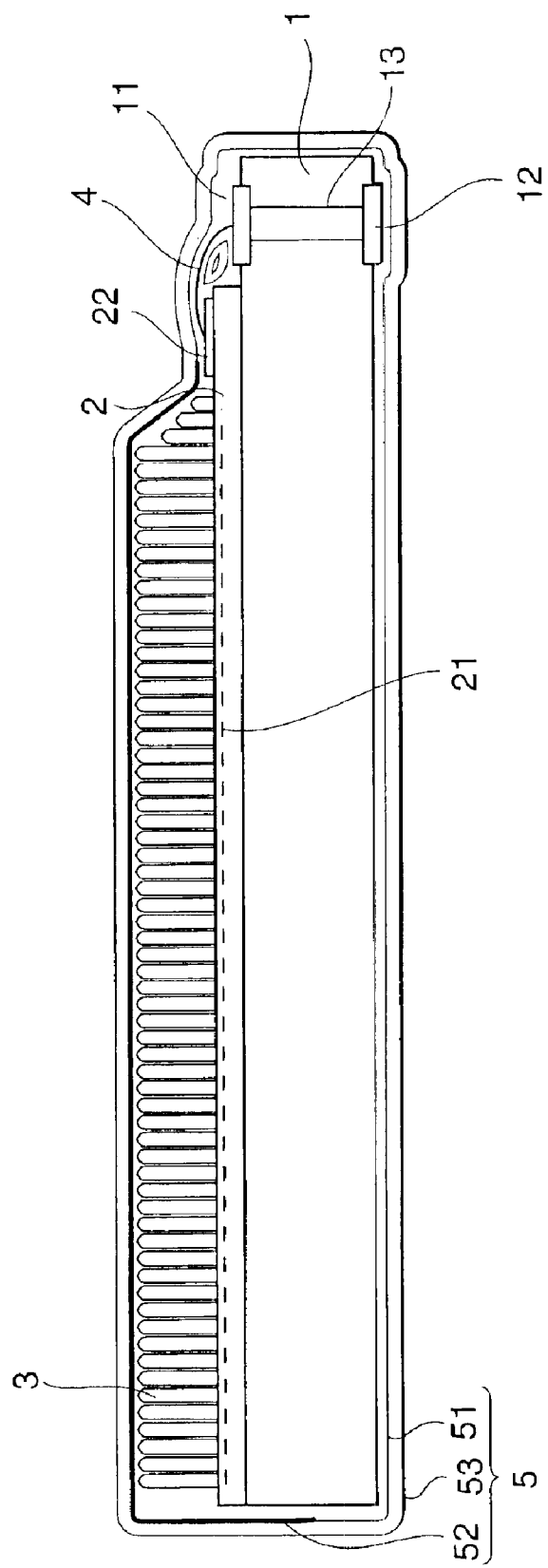

After that, parylene is applied to a thickness of 10 $\mu$m on the entire surface of the substrate by CVD again, thus forming a second organic film 53 (see FIG. 13). The second organic film 53 prevents contamination, peeling, or oxidization of the metal thin film 52 by handling or the like. In this manner, a protective film 5 as a multilayered structure of the first organic film 51, metal thin film 52, and second organic film 53 is formed.

When the metal thin film 52 is also formed on the wiring lines 4 and the electrode pads 11 and 22 via the first organic film 51, the thin film 52 and second organic film 53 are formed not only on the electrode pads 11 and 22 but also around the wiring lines 4 which connect them, and the wiring lines 4 are triple-covered with the first organic film 51. This structure increases the adhesion and mechanical strengths of the wiring lines 4. When the metal thin film 52 is formed using a mask, as described above, the wiring lines 4 and the electrode pads 11 and 22 are double-coated with the first and second organic films 51 and 53.

Of the formed protective film 5, the protective film 5 on the lower surface of the substrate 1 is removed to expose the external connection electrode terminals 12 on the lower surface of the substrate 1. As a result, the radiation detector shown in FIGS. 1 and 2 is obtained.

The operation of this embodiment will be described with reference to FIGS. 1 and 2. X-rays (radiation) coming from the incident surface reach the scintillator 3 through the protective film 5, i.e., all the second organic film 53, metal thin film 52, and first organic film 51. X-rays are absorbed by the scintillator 3, which radiates light proportional to the quantity of X-rays. Of the radiated light, light opposite to the X-ray incident direction passes through the first organic film 51 and is reflected by the metal thin film 52. Hence, almost all light generated by the scintillator 3 enters the solid-state imaging element 2. This realizes high-sensitivity measurement with high efficiency.

In the radiation detector according to the present invention, the layer of the scintillator 3 can be formed with a substantially uniform thickness on the entire light-receiving portion. Hence, the maximum effective pixel area whose output characteristics are substantially uniform can be obtained, and the light-receiving portion can be formed on the entire imaging element. When the light-receiving portion is the same as the conventional one, the detector itself can be downsized.

Each photoelectric conversion element 2 generates an electrical signal corresponding to the quantity of incident light by photoelectric conversion, and accumulates the signal for a predetermined time. The quantity of light corresponds to the quantity of incident X-rays. That is, the electrical signal accumulated in each photoelectric conversion element 2 corresponds to the quantity of incident X-rays, and an image signal corresponding to an X-ray image can be obtained. The image signal accumulated in the photoelectric conversion element 2 is output from a signal line (not shown) and finally from the electrode terminal 12 via the electrode pad 22, wiring line 4, electrode pad 11, and wiring line 13. The image signal is externally transferred, and processed by a predetermined processing circuit to display an X-ray image.

The use of this structure can decrease the thickness of the radiation detector to about 2.5 mm, which is almost half a 5-mm thickness of a radiation detector with a conventional FOP (Fiber Optical Plate). The scintillator can be uniformly formed on the light-receiving portion of the solid-state imaging element in which the light-receiving portion is formed on the entire imaging element. Hence, the downsized radiation detector having the largest light-receiving portion of the imaging element can be implemented. As a result, while ensuring almost the same area of the light-receiving portion as that of the prior art (JP 10-282243 A), the compact (about 90% the prior art) area on the incident surface side of the radiation detector can be implemented. This is greatly advantageous to a dental radiation detector used upon insertion into an oral cavity.

In the above description, the radiation detector has a structure with the protective film 5. However, when another protective means is used, i.e., when the radiation detector is used in a humidity-resistant case or when humidity-resistant material is used as a scintillator, the radiation detector need not have any protective film 5. Even if the protective film 5 is provided, the radiation detector may have various structures, e.g., a single-layered structure of an organic or inorganic film or a multilayered structure of a combination of them. The solid-state imaging element 2 may be formed from an amorphous silicon photodiode (PD) array and thin-film transistor (TFT), or may be a MOS image sensor.

Figure 14:
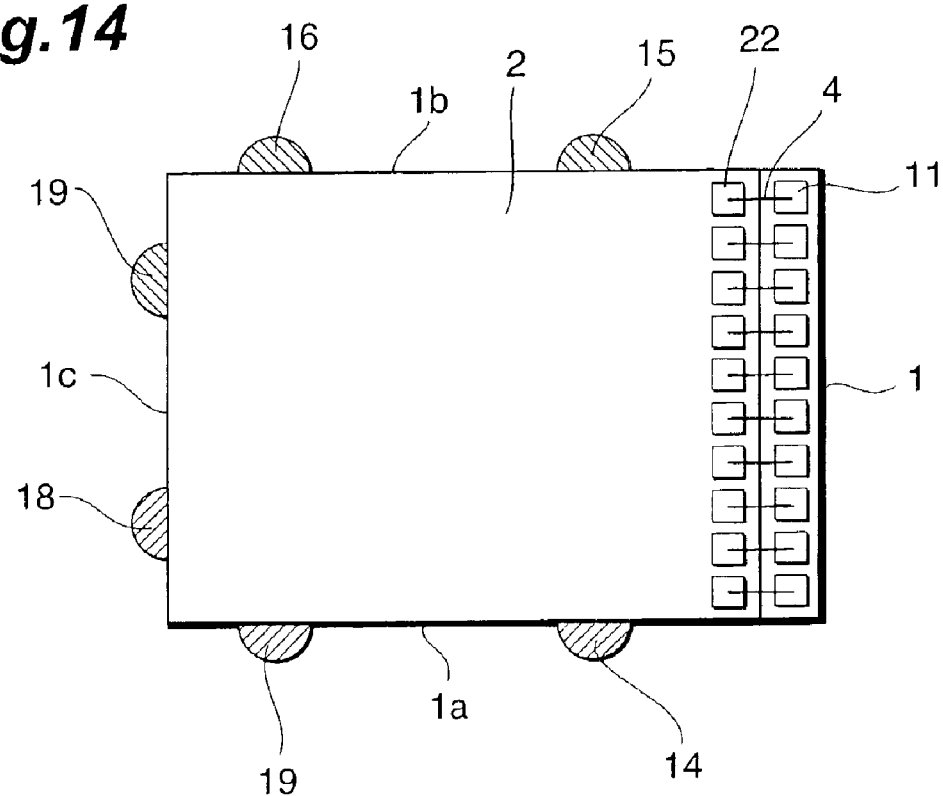
FIGS. 14 and 15 are plan and perspective views of a radiation detector according to the present invention before forming the layer of a scintillator in another embodiment.
Figure 15:
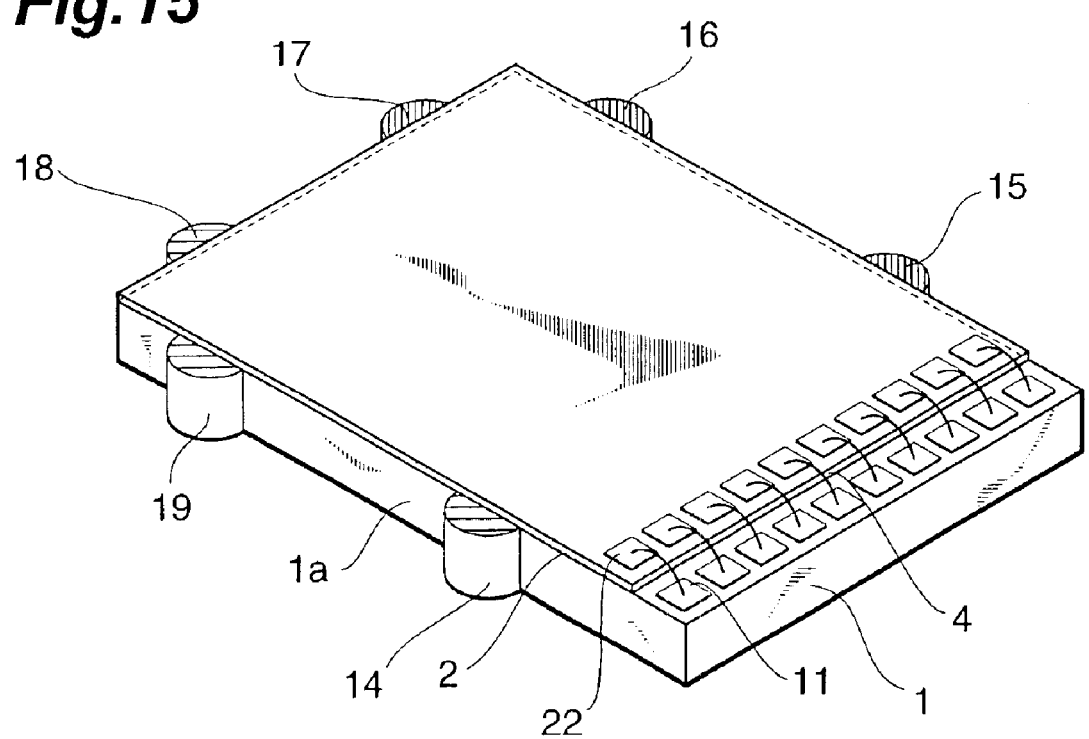

Subsequently, other embodiments of the radiation detector according to the present invention will be described. For convenience of understanding, each embodiment will be described by showing the state before a scintillator is formed. In an embodiment shown in FIGS. 14 and 15, a total of six holding portions 14 to 19 are formed in three pairs along three side walls 1a to 1c except on the side of electrodes pads 11 in a substrate 1. Each holding portion is semicircular tab-shaped when viewed from a radiation incident side. The top surfaces of these holding portions are continuously flush with a support surface.

Figure 16:
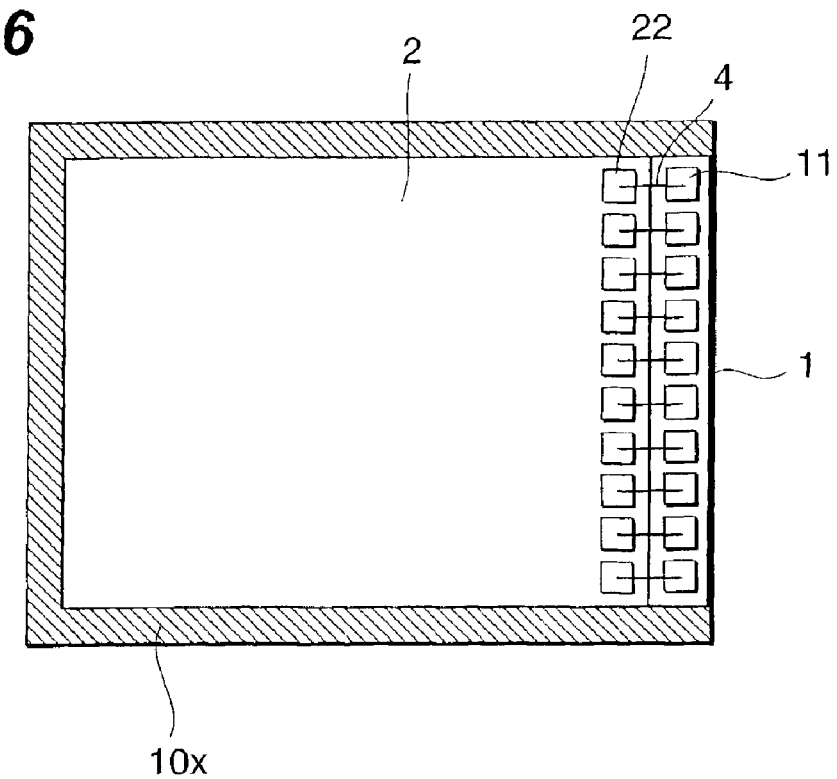
FIGS. 16 and 17 are plan and perspective views of a radiation detector according to the present invention before forming the layer of a scintillator in still another embodiment.
Figure 17:
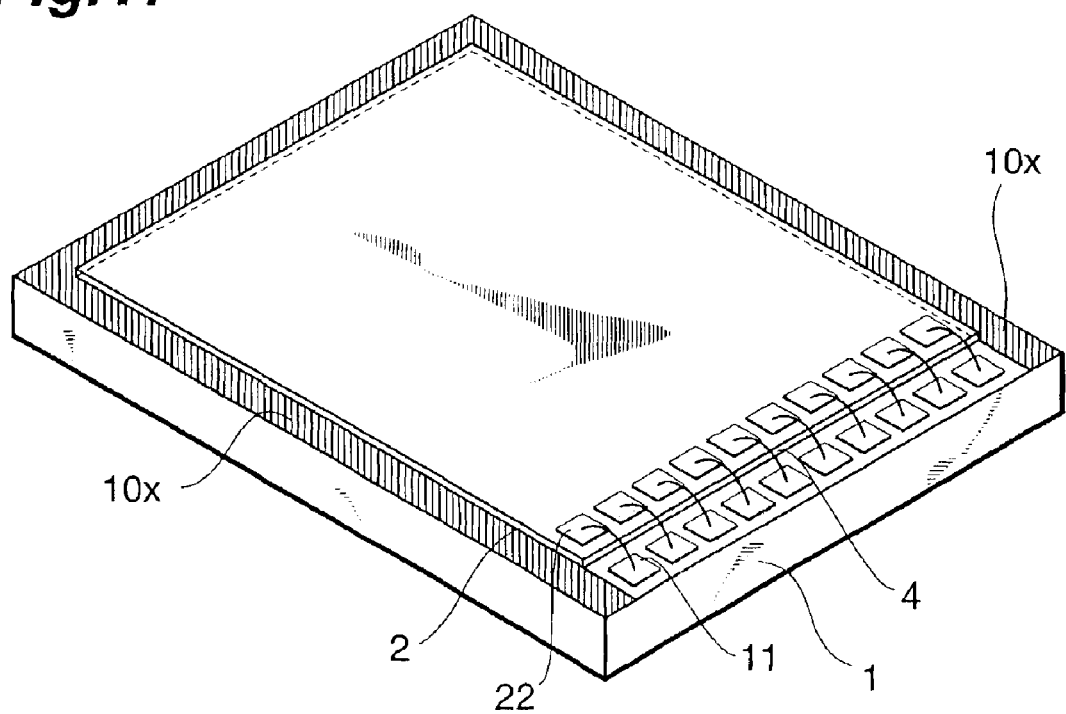

In an embodiment shown in FIGS. 16 and 17, a substrate 1 has rectangular shape, and a solid-state imaging element 2 is mounted at almost the center of the upper surface of the substrate 1. In this case, an entire U-shaped portion 10x shown by hatching, which excludes the part for mounting the solid-state imaging element 2 corresponds to the holding portions 14 and 15 in the embodiment shown in FIGS. 1 and 2.

Figure 18:
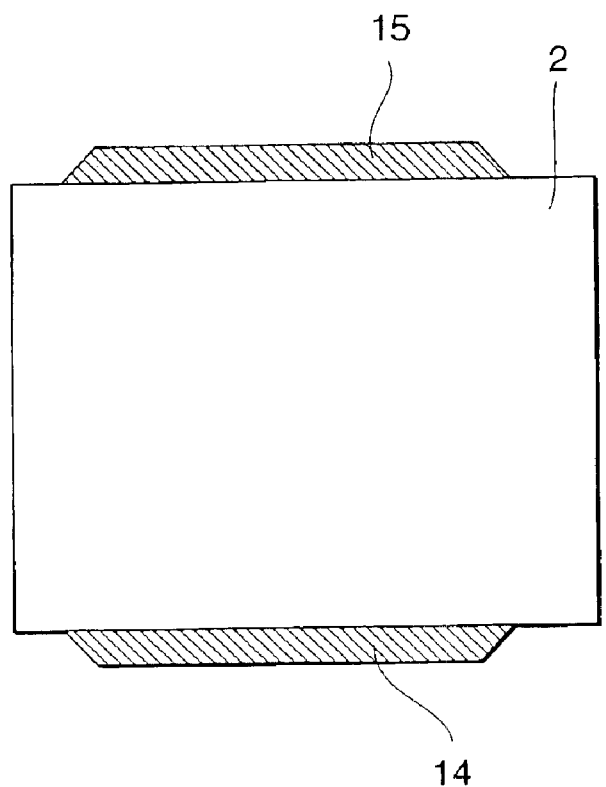
FIGS. 18 and 19 are plan and perspective views of a radiation detector according to the present invention before forming the layer of a scintillator in still another embodiment.
Figure 19:
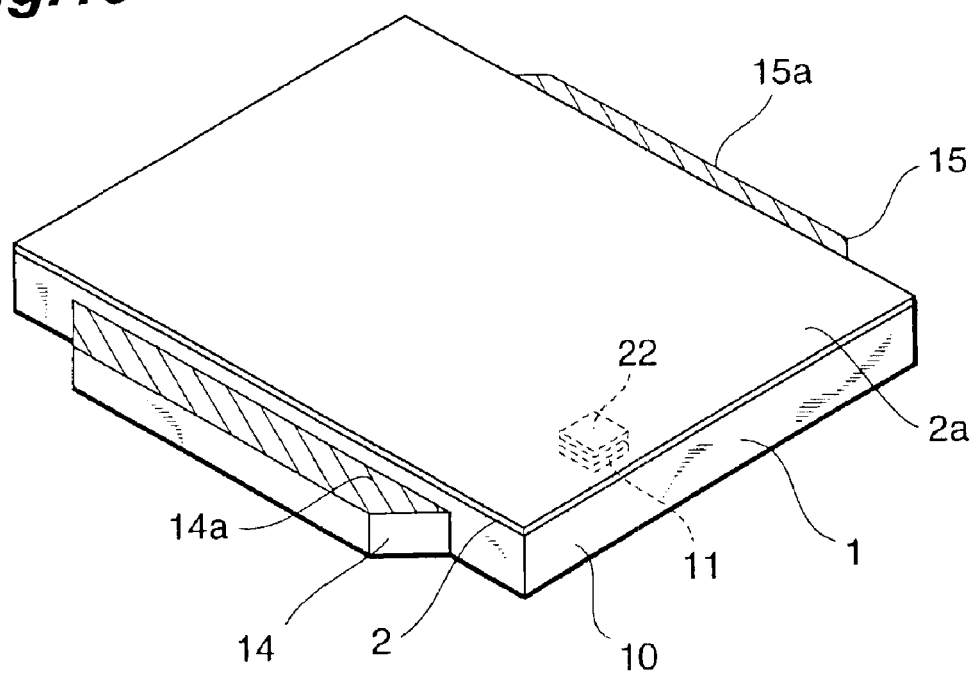

In an embodiment shown in FIGS. 18 and 19, the shape of holding portions 14 and 15 viewed from the top is the same as in the embodiment shown in FIGS. 1 and 2, except that top surfaces 14a and 15a of the holding portions 14 and 15 are lower than a support surface 10 by one step. In this embodiment, electrode pads 22 of a solid-state imaging element 2 are exposed from the lower surface of an upper surface 2a, and contact and are fixed and electrically connected to electrode pads 11 formed on the support surface 10 of a substrate 1. Hence, wiring lines which connect these electrode pads need not be used, and this facilitates assembling the radiation detector.

Figure 20:
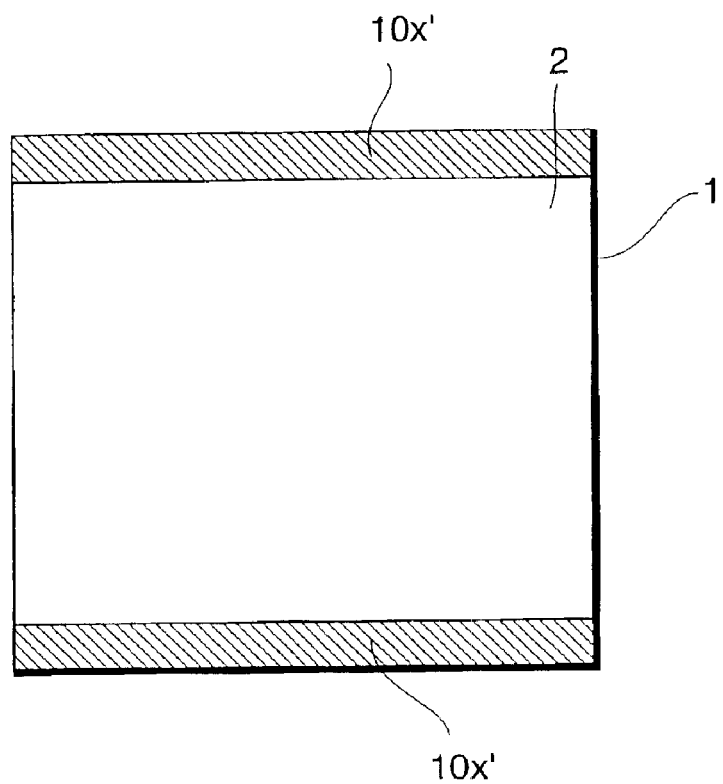
FIGS. 20 and 21 are plan and perspective views of a radiation detector according to the present invention before forming the layer of a scintillator in still another embodiment.
Figure 21:
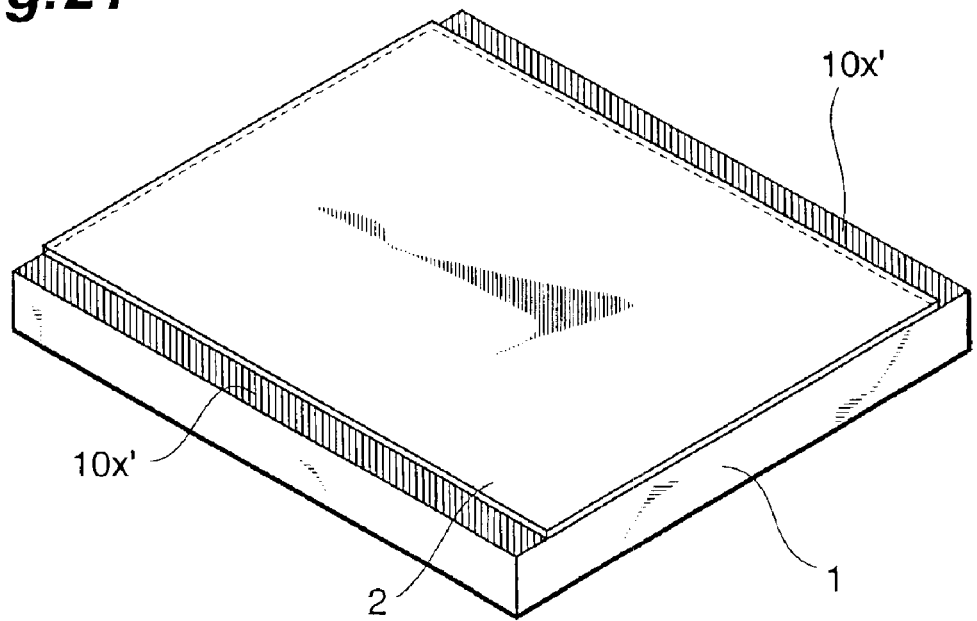

An embodiment shown in FIGS. 20 and 21 is the same as the embodiment shown in FIGS. 16 and 17 in the structure in which a substrate 1 has a rectangular shape, and a solid-state imaging element 2 is mounted on almost the center of the upper surface of the substrate 1, except that the two opposing side walls of the solid-state imaging element are located on the extensions of the opposing side walls of the substrate 1. Portions 10x' shown by hatching, which exclude the part for mounting the solid-state imaging element 2, correspond to the holding portions 14 and 15 in the embodiment shown in FIGS. 1 and 2. The portions 10x' are rectangular along the two opposing sides.

In either embodiment, the top surfaces of the holding portions are lower than the incident surface of the light-receiving portion of the mounted solid-state imaging element. Hence, the layer of the scintillator can be uniformly formed on the entire light-receiving portion after the solid-state imaging element is mounted on the substrate 1 and the wiring lines are arranged. The holding portions, i.e., portions which project laterally from the solid-state imaging element of the substrate are formed along at least the opposing side walls, i.e., along the two sides. The solid-state imaging element with the substrate can be accurately held by a vapor deposition substrate holder in forming the scintillator, and the light-receiving surface can be located to project toward a vapor deposition chamber.

INDUSTRIAL APPLICABILITY

The present invention can be preferably used as a thin and small radiation detector and a manufacturing method thereof and, more particularly, as a compact dental radiation detector used upon insertion into an oral cavity and a manufacturing method thereof.

What is claimed is:

1. A radiation detector, comprising:
    a solid-state imaging element where a plurality of photo-electric conversion elements are arranged;
    a scintillator formed on a surface of a light-receiving portion of said solid-state imaging element by vapor deposition; and
    a substrate having a support surface where said solid-state imaging element is mounted, said substrate having holding portions which project laterally from at least two opposing side surfaces of said mounted solid-state imaging element to hold and project the surface of the light-receiving portion of said solid-state imaging element from a vapor deposition holder into a vapor deposition chamber in forming said scintillator,
    wherein the holding portions are tab-shaped to conform to side walls of said substrate.

2. A radiation detector according to claim 1, wherein upper surfaces of the holding portions are continuously flush with the support surface.

3. A radiation detector, comprising:
    a solid-state imaging element where a plurality of photo-electric conversion elements are arranged;
    a scintillator formed on a surface of a light-receiving portion of said solid-state imaging element by vapor deposition; and
    a substrate having a support surface where said solid-state imaging element is mounted, said substrate having holding portions which project laterally from at least two opposing side surfaces of said mounted solid-state imaging element to hold and project the surface of the light-receiving portion of said solid-state imaging element from a vapor deposition holder into a vapor deposition chamber in forming said scintillator,
    wherein upper surfaces of the holding portions are continuously flush with the support surface.

* * * * *